United States Patent
Takizawa et al.

(10) Patent No.: US 7,271,447 B2
(45) Date of Patent: Sep. 18, 2007

(54) SEMICONDUCTOR DEVICE

(75) Inventors: Teruo Takizawa, Nagano (JP); Kei Kanemoto, Nagano (JP); Juri Kato, Nagano (JP); Toshiki Hara, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/212,400

(22) Filed: Aug. 26, 2005

(65) Prior Publication Data
US 2006/0060921 A1 Mar. 23, 2006

(30) Foreign Application Priority Data
Sep. 22, 2004 (JP) .............................. 2004-274636

(51) Int. Cl.
*H01L 27/01* (2006.01)
(52) U.S. Cl. ............... 257/349; 257/348; 257/347; 257/E29.233; 257/E29.27; 438/526; 438/370
(58) Field of Classification Search ........ 257/349–347, 257/351–354; 438/526, 370
See application file for complete search history.

(56) References Cited
U.S. PATENT DOCUMENTS 6,727,550 B2 * 4/2004 Tezuka et al. .............. 257/347
6,987,065 B2 * 1/2006 Sorada et al. ............... 438/700
2002/0134757 A1 * 9/2002 Nishizumi et al. .......... 218/118
2004/0235262 A1 11/2004 Lee et al.

FOREIGN PATENT DOCUMENTS

JP 2003-324200 11/2003

OTHER PUBLICATIONS

T. Sakai, et al., "Separation by Bonding Si Islands (SBSI) for LSI Applications", Interdisciplinary Graduate School of Science and Engineering, Tokyo Institute of Technology, pp. 230-231 (May 2004).
M. Jurczak, et al., "SON (Silicon On Nothing)—A New Device Architecture For The ULSI Era", 1999 Symposium on VLSI Technology Digest of Technical Papers, pp. 29-30 (1999).

* cited by examiner

*Primary Examiner*—Dung A. Le
(74) *Attorney, Agent, or Firm*—Harness, Dickey & Pierce, P.L.C.

(57) ABSTRACT

A semiconductor substrate includes a first semiconductor layer that is formed on a semiconductor base substrate, a second semiconductor layer that is formed on the first semiconductor layer and that has an etching selection ratio smaller than that of the first semiconductor layer, a cavity portion that is formed below the second semiconductor layer by removing a portion of the first semiconductor layer, a thermal oxidation film that is formed on the surface of the second semiconductor layer in the cavity portion, and a buried insulating film that is buried in the cavity portion.

2 Claims, 6 Drawing Sheets

SEMICONDUCTOR DEVICE

RELATED APPLICATIONS

This application claims priority to Japanese Patent Application No. 2004-274636 filed Sep. 22, 2004 which is expressly incorporated by reference herein in its entirety.

BACKGROUND

1. Technical Field

The present invention relates to a semiconductor substrate, to a semiconductor device, to a method of manufacturing a semiconductor substrate, and to a method of manufacturing a semiconductor device. More particularly, the present invention relates to a semiconductor substrate, which is suitable for a field effect transistor formed on a silicon-on-insulator (SOI) substrate, to a semiconductor device, to a method of manufacturing a semiconductor substrate, and to a method of manufacturing a semiconductor device.

2. Related Art

Field effect transistors formed on SOI substrates have attracted attention in view of their availability because of various advantages, such as the convenience of element separation, latch-up-free property, small source/drain junction capacitance, and the like. In particular, since a fully depleted-type SOI transistor has low power consumption, high-speed operation, and ease of low-voltage driving, an SOI transistor that can be driven in the fully depleted mode has been studied in earnest. Here, as the SOI substrate, for example, a SIMOX (Separation by Implanted Oxygen) substrate or a bonding substrate is used.

Further, for example, in M. Jurczak, T. Skotnicki, M. Paoli, B. Tormen, J-L. Regolini, C. Morin, A. Schittz, J. Martins, R. Pantel, and J. Galvier, "SON (Silicon On Nothing)—A NEW DEVICE ARCHITECTURE FOR THE ULSI ERA", 1999 Symposium on VLSI Technology Digest of Technical Papers, pp. 29-30 (hereinafter, referred to as Non-Patent Document 1), a method has been disclosed in which a gate electrode is formed on a silicon-on-nothing (SON) substrate. That is, in this method, the gate electrode is formed on a semiconductor substrate that has a laminated structure of Si/SiGe/Si. Then, a Si/SiGe/Si layer on both sides of the gate electrode is etched so as to expose a SiGe layer on both sides of the gate electrode. Next, the SiGe layer is selectively removed by wet-etching, such that a cavity is formed below a Si layer on which the gate electrode is disposed. Subsequently, after epitaxial growth is selectively performed on both sides of the gate electrode, ion implantation is performed, such that source and drain layers are formed on both sides of the gate electrode.

However, in order to manufacture the SIMOX substrate, the ion implantation of oxygen with high concentration must be performed on a silicon wafer. Further, in order to manufacture the bonding substrate, after two silicon wafers are bonded to each other, the surfaces of the silicon wafers must be polished. For this reason, in the SOI transistor, there is a problem in that the manufacturing cost is increased, as compared to a field effect transistor formed in a bulk semiconductor.

Further, in the ion implantation or polishing, the variation in the film thickness of an SOI layer is large. Further, when the SOI layer is reduced in thickness in order to prepare the fully depleted-type SOI transistor, there is a problem in that characteristics of the field effect transistor are difficult to stabilize.

Further, in the method disclosed in Non-Patent Document 1, the SON structure is formed only below the gate electrode, while the SON structure cannot be formed in the source and drain regions. Accordingly, there is a problem in that the parasitic capacitance of the source or drain region cannot be reduced. Further, since the cavity below the Si layer, on which the gate electrode is disposed, serves as an air layer, the Si layer has many defects, and thus the mechanical strength or thermal conductivity deteriorates, as compared to the bulk semiconductor. In addition, there is a problem in that there is a lack of reliability.

SUMMARY

An advantage of the invention is that it provides a semiconductor substrate which can form a semiconductor layer on an insulator with high reliability at low cost, without being restricted by the arrangement position of the semiconductor layer formed on the insulator, a semiconductor device, a method of manufacturing a semiconductor substrate, and a method of manufacturing a semiconductor device.

According to a first aspect of the invention, a semiconductor substrate includes a first semiconductor layer that is formed on a semiconductor base substrate, a second semiconductor layer that is formed on the first semiconductor layer and that has an etching selection ratio smaller than that of the first semiconductor layer, a cavity portion that is formed below the second semiconductor layer by removing a portion of the first semiconductor layer, a thermal oxidation film that is formed on the surface of the second semiconductor layer in the cavity portion, and a buried insulating film that is buried in the cavity portion.

In accordance with the first aspect of the invention, even when the cavity portion is formed below the second semiconductor layer, the second semiconductor layer can be supported by the first semiconductor layer. Further, a material for the buried insulating film that is buried in the cavity portion can be suitably selected, and thus the dielectric constant of the insulating film buried in the cavity portion can be reduced. For this reason, the second semiconductor layer can be electrically isolated from the semiconductor base substrate, without damaging the quality of the second semiconductor layer, such that the parasitic capacitance of the second semiconductor layer can be reduced. Further, the second semiconductor layer can be formed on the insulator with high reliability at low cost.

Further, according to a second aspect of the invention, a semiconductor device includes a first semiconductor layer that is formed on a semiconductor substrate, a second semiconductor layer that is formed on the first semiconductor layer and that has an etching selection ratio smaller than that of the first semiconductor layer, a cavity portion that is formed below the second semiconductor layer by removing a portion of the first semiconductor layer, a thermal oxidation film that is formed on the surface of the second semiconductor layer in the cavity portion, a buried insulating film that is buried in the cavity portion, a gate electrode that is formed on the second semiconductor layer above the buried insulating film, and source and drain layers that are formed in the second semiconductor layer above the buried insulating film and that are disposed on both sides of the gate electrode.

In accordance with the second aspect of the invention, a crystal defect of the second semiconductor layer can be reduced. Further, the material for the buried insulating film that is buried in the cavity portion can be suitably selected, and thus the dielectric constant of the insulating film buried in the cavity portion can be reduced. For this reason, the second semiconductor layer can be electrically isolated from the semiconductor substrate, without damaging the quality of the second semiconductor layer, such that the parasitic capacitance of the second semiconductor layer can be reduced. In addition, the quality and characteristics of the SOI transistor can be enhanced, while an increase in manufacturing costs can be suppressed.

Further, in the semiconductor device according to the second aspect of the invention, it is preferable that the first semiconductor layer be disposed in an element separation region.

According to this configuration, the second semiconductor layer can be supported by the first semiconductor layer. Further, the second semiconductor layer, in which a channel region and the source and drain regions of the transistor are formed, can be disposed on the insulator. For this reason, the parasitic capacitance of the source or drain region can be reduced, without causing a manufacturing process to be complicated. In addition, the quality and characteristics of the SOI transistor can be enhanced, while an increase in manufacturing costs can be suppressed.

Further, according to a third aspect of the invention, a method of manufacturing a semiconductor substrate includes forming a first semiconductor layer on a semiconductor base substrate, forming, on the first semiconductor layer, a second semiconductor layer having an etching selection ratio smaller than that of the first semiconductor layer, forming an opening that exposes at least a portion of the first semiconductor layer from the second semiconductor layer, selectively etching the first semiconductor layer via the opening to form a cavity portion, in which the portion of the first semiconductor layer is removed, below the second semiconductor layer, and burying an insulating film in the cavity portion via the opening by means of a chemical vapor deposition method.

In accordance with the third aspect of the invention, even when the cavity portion is formed below the second semiconductor layer, the second semiconductor layer can be supported by the first semiconductor layer. Further, an etching gas or an etching solution can come in contact with the first semiconductor layer below the second semiconductor layer via the opening, such that the cavity portion can be formed below the second semiconductor layer. Further, since the insulating film can be buried in the cavity portion by means of the chemical vapor deposition method, the film thickness of the insulating film that is buried in the cavity portion can be easily increased, thereby reducing the dielectric constant. As a result, the second semiconductor layer can be electrically isolated from the semiconductor base substrate, without damaging the quality of the second semiconductor layer, such that the parasitic capacitance of the second semiconductor layer can be reduced. For this reason, the second semiconductor layer can be formed on the insulator with high reliability at low cost. In addition, the characteristics of the transistor formed in the second semiconductor layer can be enhanced.

Further, the method of manufacturing a semiconductor substrate according to the third aspect of the invention may further include thermally oxidizing the second semiconductor layer so as to form a thermal oxidation film on the surface of the second semiconductor layer, in which the cavity portion is disposed.

According to this configuration, the defect of the second semiconductor layer in which the cavity portion is disposed can be reduced, and thus the characteristics of the transistor formed in the second semiconductor layer can be enhanced.

Further, in the method of manufacturing a semiconductor substrate according to the third aspect of the invention, it is preferable that the semiconductor base substrate and the second semiconductor layer be made of single-crystal Si, and the first semiconductor layer be made of single-crystal SiGe.

According to this configuration, lattice matching of the semiconductor substrate, the second semiconductor layer, and the first semiconductor layer can be achieved. Further, the etching selection ratio of the first semiconductor layer can be made larger than those of the semiconductor substrate and the second semiconductor layer. For this reason, the second semiconductor layer having superior crystal quality can be stably formed on the first semiconductor layer. Further, the second semiconductor layer can be electrically isolated from the semiconductor substrate, without damaging the quality of the second semiconductor layer.

Further, in the method of manufacturing a semiconductor substrate according to the third aspect of the invention, it is preferable that the first semiconductor layer be selectively etched by means of a treatment with fluoronitric acid.

According to this configuration, the etching selection ratio of the first semiconductor layer can be made larger than those of the semiconductor substrate and the second semiconductor layer and the first semiconductor layer can be removed by wet etching. Further, the second semiconductor layer can be electrically isolated from the semiconductor substrate, without damaging the quality of the second semiconductor layer.

Further, according to a fourth aspect of the invention, a method of manufacturing a semiconductor device includes forming a first semiconductor layer on a semiconductor substrate, forming, on the first semiconductor layer, a second semiconductor layer having an etching selection ratio smaller than that of the first semiconductor layer, forming an opening that exposes at least a portion of the first semiconductor layer from the second semiconductor layer, selectively etching the first semiconductor layer via the opening so as to form a cavity portion, in which the portion of the first semiconductor layer is removed, below the second semiconductor layer, thermally oxidizing the second semiconductor layer so as to form a thermal oxidation film on the surface of the second semiconductor layer, in which the cavity portion is disposed, burying an insulating film in the cavity portion via the opening by means of a chemical vapor deposition method, forming a gate electrode on the second semiconductor layer above the insulating film with a gate insulating film interposed therebetween, and forming source and drain layers in the second semiconductor layer above the insulating film so as to be disposed on both sides of the gate electrode.

In accordance with the fourth aspect of the invention, the second semiconductor layer can be stably supported on the semiconductor substrate and the first semiconductor layer between the second semiconductor layer and the semiconductor substrate can be removed. Further, the insulating film can be formed on the rear surface of the second semiconductor layer by the chemical vapor deposition method. For this reason, the second semiconductor layer can be electrically isolated from the semiconductor substrate by the insulating film formed between the second semiconductor layer and the semiconductor substrate. As a result, the quality and characteristics of the SOI transistor can be enhanced, while an increase in manufacturing costs can be suppressed.

Further, in the method of manufacturing a semiconductor device according to the fourth aspect of the invention, it is preferable that the opening be disposed in an element separation region.

According to this configuration, the opening for removing the first semiconductor layer below the second semiconductor layer does not need to be provided in the element formation region. As a result, the manufacturing cost of the SOI transistor can be reduced, while an increase in chip size can be suppressed.

BRIEF DESCRIPTION OF THE DRAWINGS

The invention will be described with reference to the accompanying drawings, wherein like numbers reference like elements, and wherein.

DETAILED DESCRIPTION

Figure 1A:
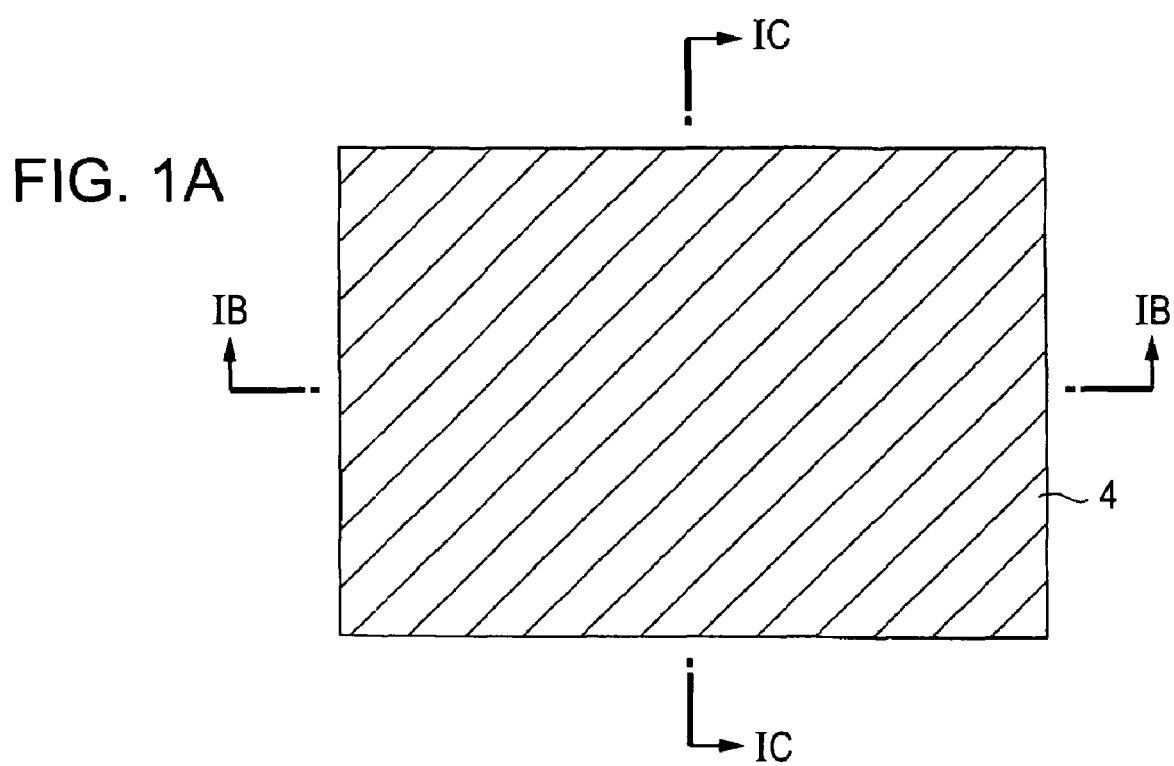
FIG. 1A is a diagram showing a manufacturing method of a semiconductor device according to an embodiment of the invention.
Figure 1B:
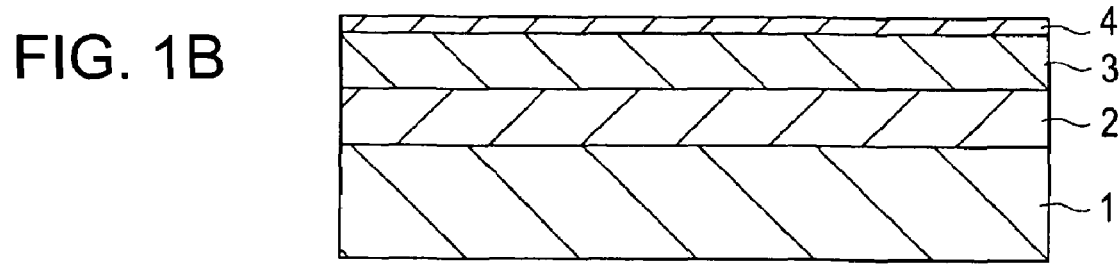
FIG. 1B is a diagram showing the manufacturing method of a semiconductor device according to the embodiment of the invention.
Figure 1C:
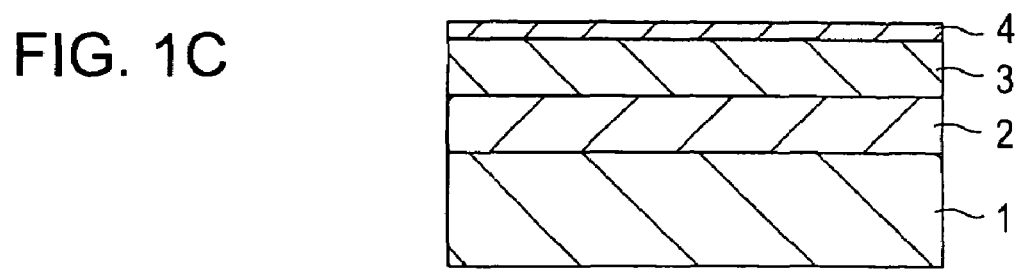
FIG. 1C is a diagram showing the manufacturing method of a semiconductor device according to the embodiment of the invention.

Hereinafter, a semiconductor device and a manufacturing method thereof according to an embodiment of the invention will be described with reference to the drawings.

FIGS. 1A, 2A, 3A, 4A, 5A, and 6A are plan views showing the manufacturing method of the semiconductor device according to the embodiment of the invention. FIGS. 1B, 2B, 3B, 4B, 5B, and 6B are cross-sectional views taken along the lines IB-IB, IIB-IIB, IIIB-IIIB, IVB-IVB, VB-VB, and VIB-VIB of FIGS. 1A, 2A, 3A, 4A, 5A, and 6A, respectively. FIGS. 1C, 2C, 3C, 4C, 5C, and 6C are cross-sectional views taken along the lines IC-IC, IIC-IIC, IIIC-IIIC, IVC-IVC, VC-VC, and VIC-VIC of FIGS. 1A, 2A, 3A, 4A, 5A, and 6A, respectively.

In FIG. 1, a first semiconductor layer 2 is formed on a semiconductor substrate 1 by epitaxial growth and a second semiconductor layer 3 is formed on the first semiconductor layer 2 by epitaxial growth. Moreover, the first semiconductor layer 2 can be made of a material having an etching selection ratio larger than those of the semiconductor substrate 1 and the second semiconductor layer 3. The materials for the semiconductor substrate 1, the first semiconductor layer 2, and the second semiconductor layer 3 can include, for example, a combination selected from Si, Ge, SiGe, SiC, SiSn, PbS, GaAs, InP, GaP, GaN, ZnSe, and the like. In particular, when the semiconductor substrate 1 is made of Si, preferably, the first semiconductor layer 2 is made of SiGe and the second semiconductor layer 3 is made of Si. Accordingly, lattice matching between the first semiconductor layer 2 and the second semiconductor layer 3 can be achieved and the selection ratio between the first semiconductor layer 2 and the second semiconductor layer 3 can be secured. Further, when the first semiconductor layer 2 is made of SiGe and the second semiconductor layer 3 is made of Si, as regards the Ge concentration distribution in the first semiconductor layer 2, in order to prevent a defective laminate occurring at an interface between the semiconductor substrate 1 and the first semiconductor layer 2 and at an interface between the first semiconductor layer 2 and the second semiconductor layer 3 to the utmost, the Ge concentrations in the bottom surface and the top surface of the first semiconductor layer 2 are preferably set to be 20% or less. Further, in order to increase selectivity at the time of subsequent selective etching, the Ge concentration of an intermediate layer of the first semiconductor layer 2 is preferably set to be 20% or more. Moreover, the first semiconductor layer 2 and the second semiconductor layer 3 are preferably made of a single-crystal semiconductor. Further, the first semiconductor layer 2 and the second semiconductor layer 3 may be made of an amorphous semiconductor, a polycrystalline semiconductor, or a porous semiconductor. Further, for example, the film thickness of the first semiconductor layer 2 may be about 2000 Å and the film thickness of the second semiconductor layer 3 may be about 1000 Å. Then, the second semiconductor layer 3 is thermally oxidized so as to form an oxidation film 4 on the surface of the second semiconductor layer 3. Moreover, for example, the film thickness of the oxidation film 4 may be about 250 Å. Here, the oxidation film 4 is formed on the second semiconductor layer 3, and thus the second semiconductor layer 3 can be reduced in thickness. Therefore, with the oxidation film 4, the second semiconductor layer 3 can be reinforced when a cavity portion 9 is formed below the second semiconductor layer 3.

Figure 2A:
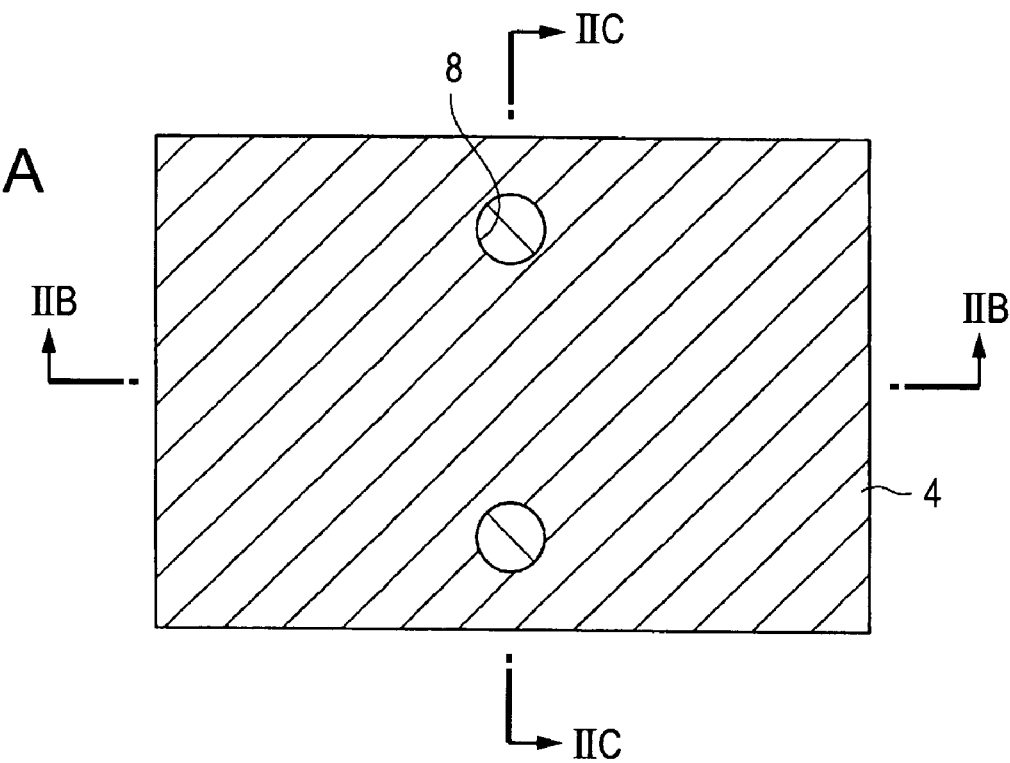
FIG. 2A is a diagram showing the manufacturing method of a semiconductor device according to the embodiment of the invention.
Figure 2B:
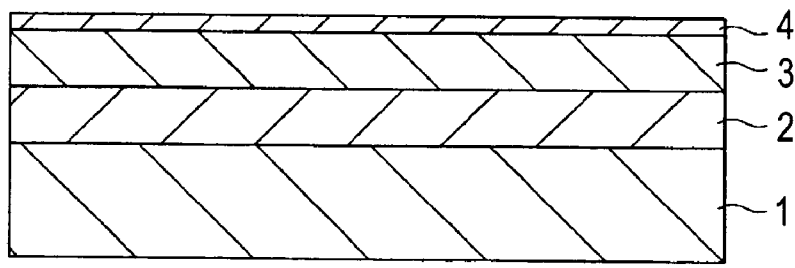
FIG. 2B is a diagram showing the manufacturing method of a semiconductor device according to the embodiment of the invention.
Figure 2C:
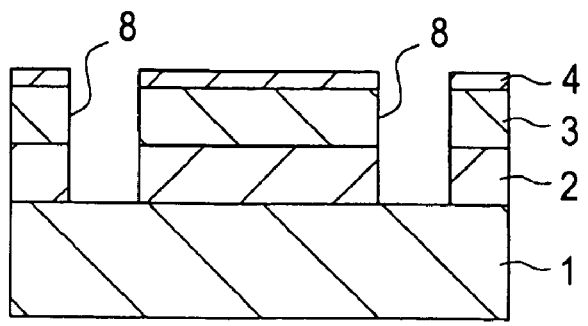
FIG. 2C is a diagram showing the manufacturing method of a semiconductor device according to the embodiment of the invention.

Next, as shown in FIGS. 2A to 2C, the oxidation film 4, the second semiconductor layer 3, and the first semiconductor layer 2 are patterned by a photolithography technique and an etching technique, such that an opening 8 is formed to expose a portion of the first semiconductor layer 2. Here, the opening 8 is preferably disposed in an element separation region of the second semiconductor layer 3. Accordingly, the opening 8 for removing the first semiconductor layer 2 below the second semiconductor layer 3 does not need to be provided in an element formation region. Therefore, the manufacturing cost of an SOI transistor can be reduced, while an increase in chip size can be suppressed.

Moreover, at the time of exposing the portion of the first semiconductor layer 2, etching may stop in the surface of the first semiconductor layer 2. Alternatively, the first semiconductor layer 2 may be overetched so as to form a concave portion in the first semiconductor layer 2. Further, the first semiconductor layer 2 in the opening 8 may be removed such that the surface of the semiconductor substrate 1 is exposed. Here, etching of the first semiconductor layer 2 may stop halfway, such that the surface of the semiconductor substrate 1 in the opening 8 can be prevented from being exposed. For this reason, when the first semiconductor layer 2 is removed by etching, the time for which the semiconductor substrate 1 in the opening 8 is exposed to an etching solution or an etching gas can be reduced and overetching of the semiconductor substrate 1 in the opening 8 can be suppressed.

Figure 3A:
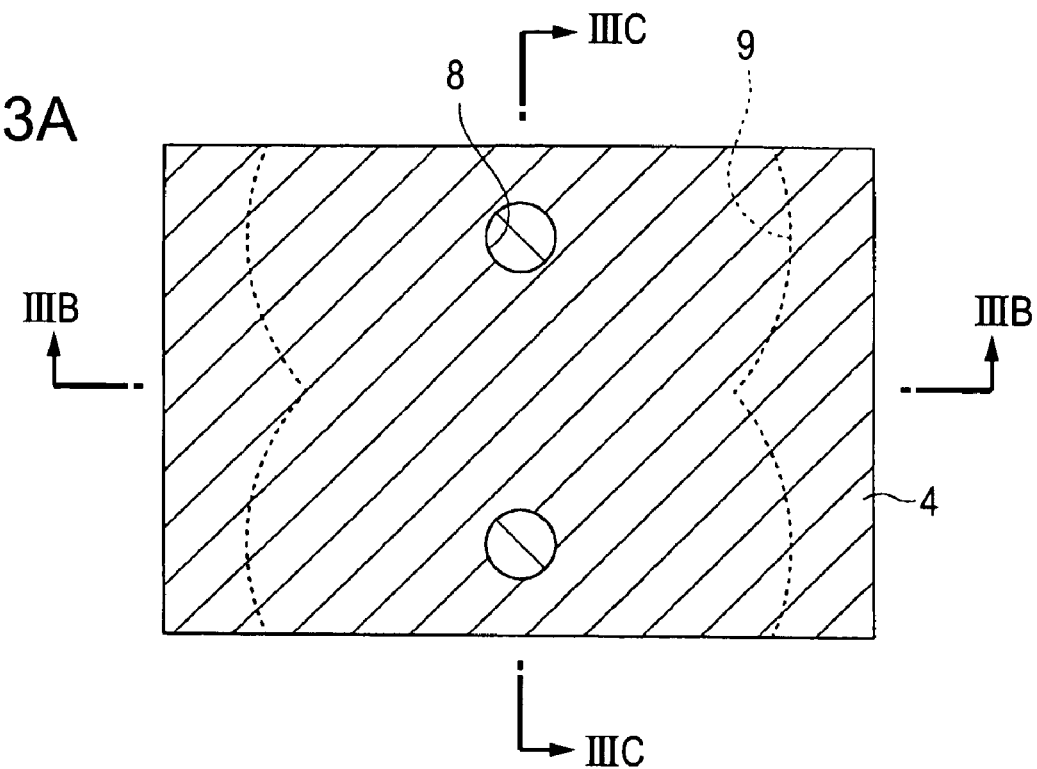
FIG. 3A is a diagram showing the manufacturing method of a semiconductor device according to the embodiment of the invention.
Figure 3B:
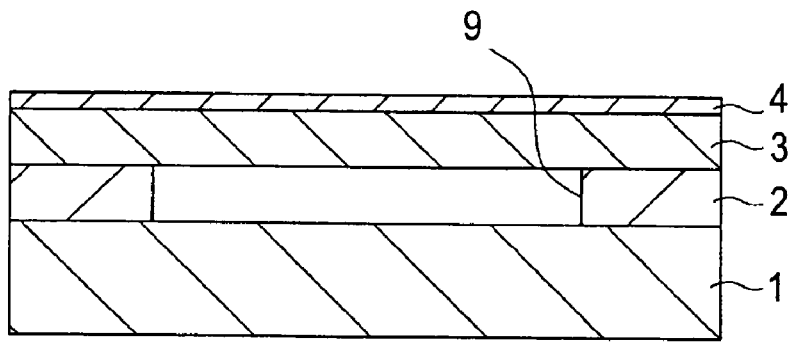
FIG. 3B is a diagram showing the manufacturing method of a semiconductor device according to the embodiment of the invention.
Figure 3C:
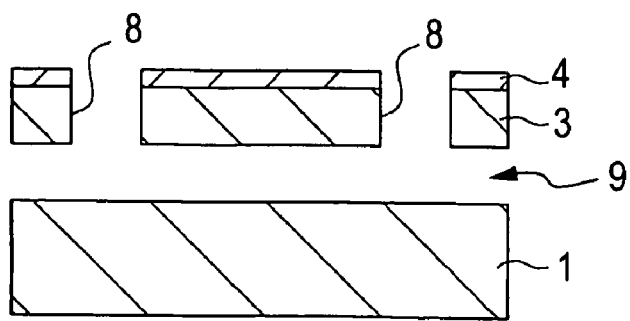
FIG. 3C is a diagram showing the manufacturing method of a semiconductor device according to the embodiment of the invention.

Next, as shown in FIGS. 3A to 3C, the etching gas or the etching solution comes in contact with the first semiconductor layer 2 via the opening 8, so that the portion of the first semiconductor layer 2 is removed by etching and the cavity portion 9 is formed between the semiconductor substrate 1 and the second semiconductor layer 3.

Moreover, when the portion of the first semiconductor layer 2 is removed by etching, it is preferable that the first semiconductor layer 2 below the channel region and the source and drain regions of the transistor be removed, while the first semiconductor layer 2 remains in the element separation region.

Here, since the portion of the first semiconductor layer 2 is removed by etching, the second semiconductor layer 3 can be supported on the semiconductor substrate 1 and the cavity portion 9 can be formed below the second semiconductor layer 3. For this reason, the second semiconductor layer 3 can be disposed on an insulator, without damaging the quality of the second semiconductor layer 3. Therefore, the second semiconductor layer 3 can be formed on the insulator with high reliability at low cost.

Further, since the first semiconductor layer 2 remains in the element separation region, the second semiconductor layer 3, in which the channel region and the source and drain regions of the transistor are formed, can be disposed on the insulator. For this reason, the parasitic capacitance of the source or drain region can be reduced, without causing the manufacturing process to be complicated. Further, the quality and characteristics of the SOI transistor can be enhanced, while an increase in manufacturing costs can be suppressed.

Further, when the semiconductor substrate 1 and the second semiconductor layer 3 are made of Si and the first semiconductor layer 2 is made of SiGe, fluoronitric acid may be used as the etching solution of the first semiconductor layer 2. Accordingly, a selection ratio of Si and SiGe of about 1:1000 to 1:10000 can be obtained. Therefore, the first semiconductor layer 2 can be removed while overetching of the semiconductor substrate 1 and the second semiconductor layer 3 is suppressed. At this time, an electric field may be applied to the semiconductor substrate 1 so as to speed up selective etching of the first semiconductor layer 2.

Figure 4A:
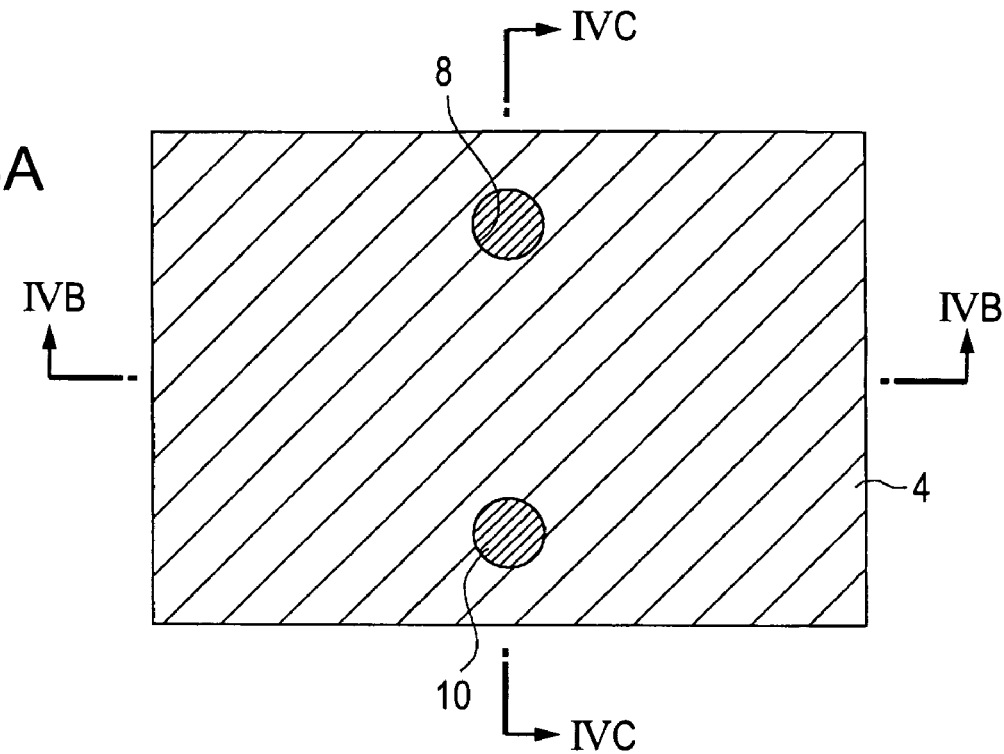
FIG. 4A is a diagram showing the manufacturing method of a semiconductor device according to the embodiment of the invention.
Figure 4B:
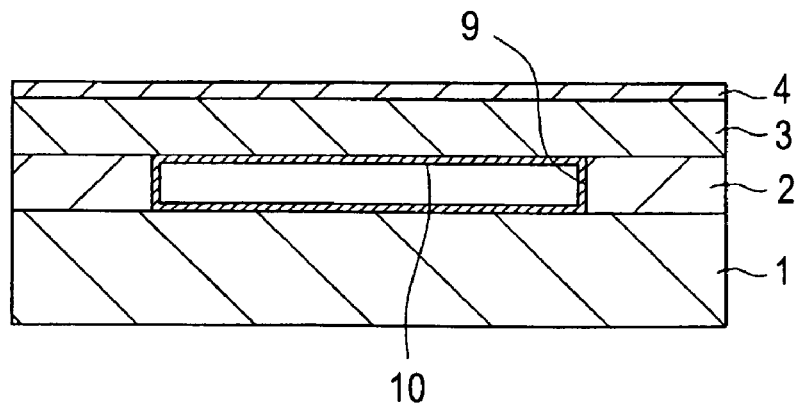
FIG. 4B is a diagram showing the manufacturing method of a semiconductor device according to the embodiment of the invention.
Figure 4C:
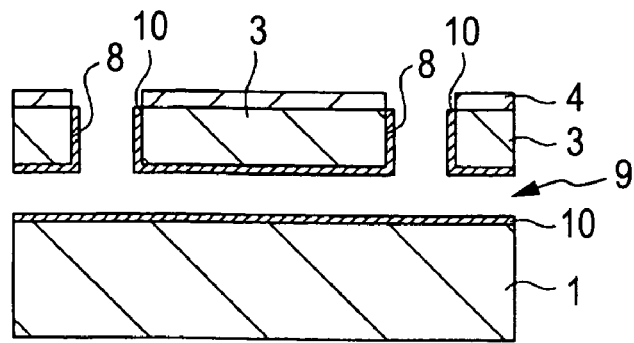
FIG. 4C is a diagram showing the manufacturing method of a semiconductor device according to the embodiment of the invention.

Next, as shown in FIGS. 4A to 4C, an oxidizing gas enters the cavity portion 9 via the opening 8 in order to thermally oxidize the surfaces of the semiconductor substrate 1 and the second semiconductor layer 3 in the cavity portion 9, such that thermal oxidation films 10 are formed on the surfaces of the semiconductor substrate 1 and the second semiconductor layer 3 in the cavity portion 9.

Accordingly, a surface defect of the second semiconductor layer 3 in which the cavity portion 9 is disposed can be reduced, and also the sub-threshold slope of the transistor formed in the second semiconductor layer 3 can be prevented from deteriorating. Moreover, for example, the film thickness of the thermal oxidation film 10 may be in a range of from about 10 to 70 Å. Further, in order to reduce the surface defect of the second semiconductor layer 3, an oxidation rate may be delayed and a dry oxidation method may be used.

Further, after the oxidation film 10 is formed in the second semiconductor layer 3, hydrogen annealing may be performed. Accordingly, a dangling bond in the surface of the second semiconductor layer 3 can be terminated by hydrogen, and the level of interface in the surface of the second semiconductor layer 3 can also be reduced.

Figure 5A:
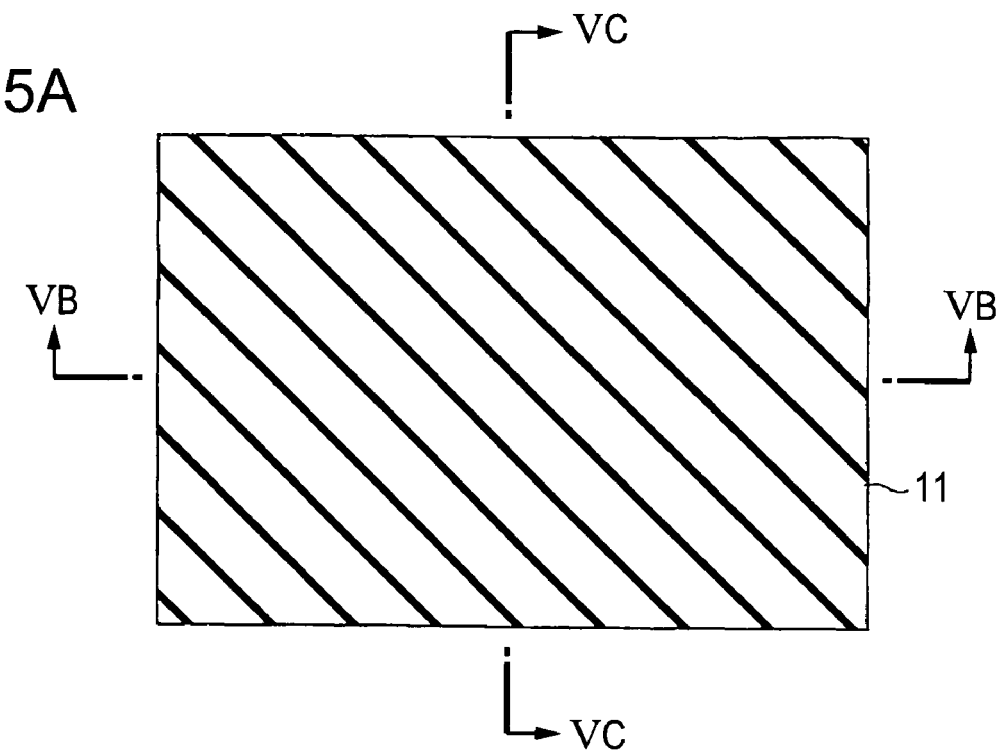
FIG. 5A is a diagram showing the manufacturing method of a semiconductor device according to the embodiment of the invention.
Figure 5B:
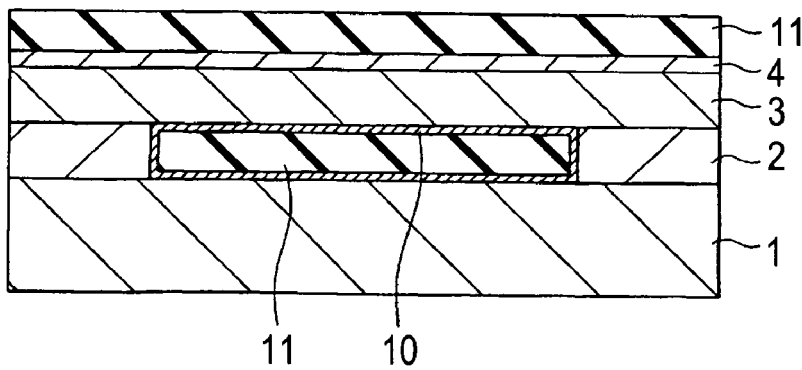
FIG. 5B is a diagram showing the manufacturing method of a semiconductor device according to the embodiment of the invention.
Figure 5C:
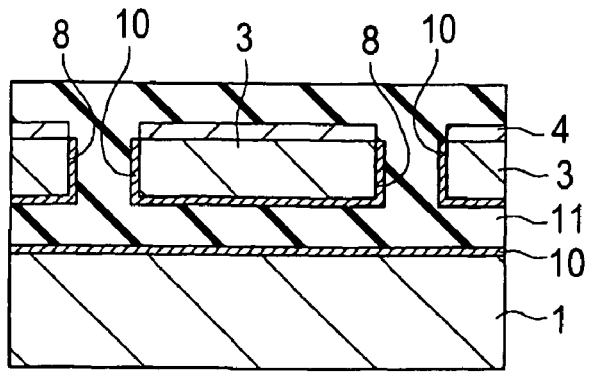
FIG. 5C is a diagram showing the manufacturing method of a semiconductor device according to the embodiment of the invention.

Next, as shown in FIGS. 5A to 5C, a buried insulating film 11 is buried in the cavity portion 9 via the opening 8, for example, by a low pressure CVD (chemical vapor deposition) method. Accordingly, the dielectric constant of the buried insulating film 11 buried in the cavity portion 9 can be reduced by suitably selecting a material for the buried insulating film 11 buried in the cavity portion 9. For this reason, the parasitic capacitance of the second semiconductor layer 3 can be reduced and thus the transistor formed in the second semiconductor layer 3 can operate at high speed and can have low power consumption. Moreover, when the film-formation rate of the buried insulating film 11 is delayed, the buried insulating film 11 can spread throughout the cavity portion 9, such that the buried insulating film 11 can be fully buried in the cavity potion 9. Moreover, a material for the buried insulating film 11 includes, for example, silicon dioxide, but a material having a dielectric constant smaller than that of silicon dioxide is preferably used. For example, FSG (fluorine-doped silicate glass) may be used. Further, for example, organic low-k films (containing C, O, and H, not Si) or hybrid low-k films (containing Si, in addition to C, O, and H) may be used. Further, in addition to PAE (poly aryleneether)-based films, such as 'SiLK' (available from Dow Chemical Co. in USA), HSQ (hydrogen silsesquioxane)-based films, MSQ (methyl silsesquioxane)-based films, PCB-based films, CF-based films, SiOC-based films, such as 'CORAL' (available from Novellus Systems, Inc. in U.S.A.), 'Black Diamond' (available from Applied Materials, Inc. in U.S.A.), 'Aurora 2.7' (available from ASM Japan K.K.), or the like, SiOF-based films, or porous films thereof may be used.

Further, the film thickness of the second semiconductor layer 3 after the buried insulating film 11 is formed below the second semiconductor layer 3 can be defined by the film thickness of the second semiconductor layer 3 at the time of the epitaxial growth. For this reason, the buried insulating film 11 can be formed below the second semiconductor layer 3, while the film thickness of the second semiconductor layer 3 can be controlled with high precision. Therefore, a variation in film thickness of the second semiconductor layer 3 can be reduced.

Figure 6A:
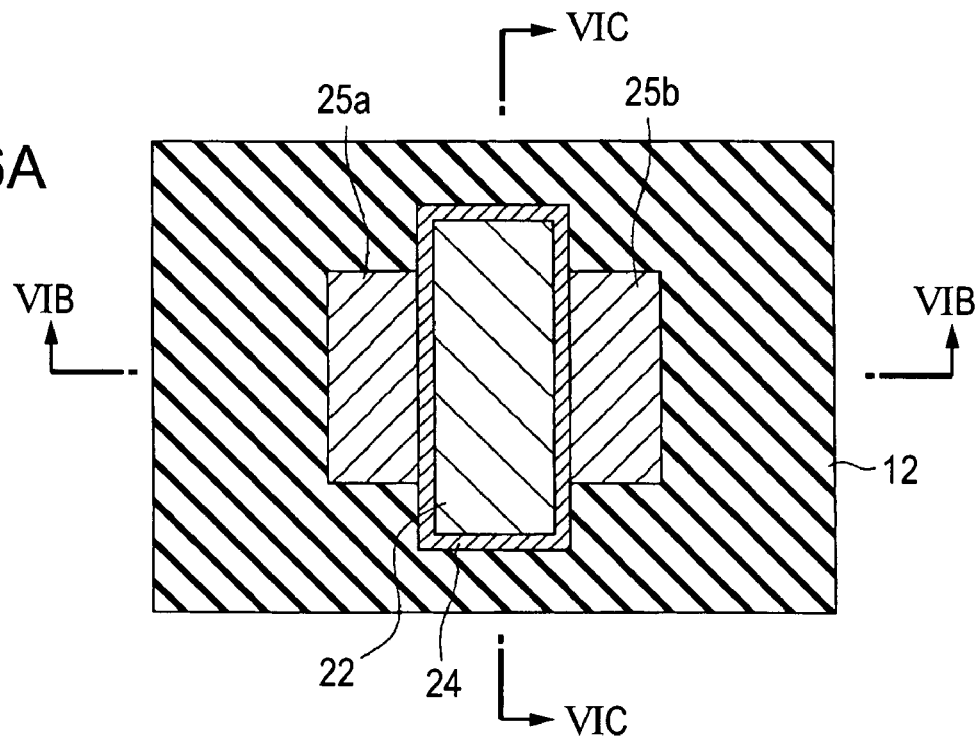
FIG. 6A is a diagram showing the manufacturing method of a semiconductor device according to the embodiment of the invention.
Figure 6B:
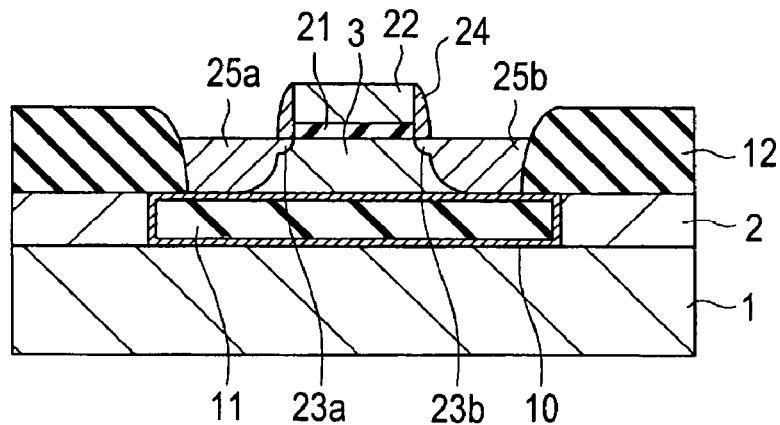
FIG. 6B is a diagram showing the manufacturing method of a semiconductor device according to the embodiment of the invention.
Figure 6C:
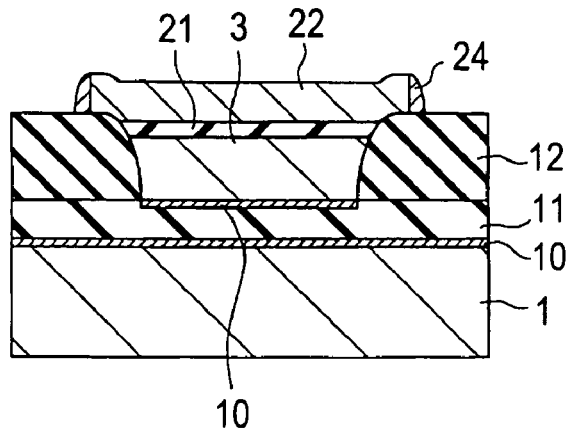
FIG. 6C is a diagram showing the manufacturing method of a semiconductor device according to the embodiment of the invention.

Next, as shown in FIGS. 6A to 6C, the buried insulating film 11 and the oxidation film 4 on the second semiconductor layer 3 are removed so as to expose the surface of the second semiconductor layer 3. Then, after an element separation region 12 is formed, the surface of the second semiconductor layer 3 is thermally oxidized so as to form a gate insulating film 21 in the surface of the second semiconductor layer 3. Next, a polycrystalline silicon layer is formed on the second semiconductor layer 3, in which the gate insulating film 21 is formed, by the CVD method or the like. Subsequently, the polycrystalline silicon is patterned by using the photolithography technique and the etching technique, such that a gate electrode 22 is formed on the second semiconductor layer 3.

Next, with the gate electrode 22 as a mask, impurity ions of As, P, B, or the like are implanted into the second semiconductor layer 3, such that LDD layers 23a and 23b made of lightly-doped impurity layers are formed in the second semiconductor layer 3 to be disposed on both sides of the gate electrode 22. Then, an insulating film is formed on the second semiconductor layer 3, in which the LDD layers 23a and 23b are formed, by the CVD method or the like. Further, the insulating film is etched by using anisotropic etching, such as RIE or the like, so as to form side walls 24 on the side walls of the gate electrode 22. Subsequently, with the gate electrode 22 and the side walls 24 as a mask, impurity ions of As, P, B, or the like are implanted into the second semiconductor layer 3, such that source and drain layers 25a and 25b made of heavily-doped impurity layers are formed in the second semiconductor layer 3 to be disposed on sides of the side walls 24.

Accordingly, the second semiconductor layer 3 can be disposed on the buried insulating film 11, while an increase in the number of processes can be suppressed. Further, an increase in the number of defects of the second semiconductor layer 3 can be suppressed. For this reason, the second semiconductor layer 3 can be electrically isolated from the semiconductor substrate 1, without damaging the quality of the second semiconductor layer 3. Further, the quality of the SOI transistor can be enhanced, while an increase in manufacturing costs can be suppressed.

What is claimed is:

1. A semiconductor device comprising:
   a first semiconductor layer that is formed on a semiconductor substrate;
   a second semiconductor layer that is formed on the first semiconductor layer and that has an etching selection ratio smaller than that of the first semiconductor layer;
   a cavity portion that is formed below the second semiconductor layer by removing a portion of the first semiconductor layer;
   a thermal oxidation film that is formed on the surface of the second semiconductor layer in the cavity portion;
   a buried insulating film that is buried in the cavity portion;
   a gate electrode that is formed on the second semiconductor layer above the buried insulating film; and
   source and drain layers that are formed in the second semiconductor layer above the buried insulating film and that are disposed on both sides of the gate electrode.

2. The semiconductor device according to claim 1, wherein the first semiconductor layer is disposed in an element separation region.

* * * * *